(12) United States Patent
Tamura et al.

(10) Patent No.: US 8,235,603 B2
(45) Date of Patent: Aug. 7, 2012

(54) OPTOELECTRIC CONVERSION MODULE, METHOD FOR ASSEMBLING SAME, AND OPTOELECTRIC INFORMATION PROCESSOR USING SAME

(75) Inventors: Mitsuaki Tamura, Yokohama (JP); Wataru Sakurai, Yokohama (JP); Hideki Matsubara, Osaka (JP); Hideaki Toshioka, Osaka (JP); Kyouichirou Nakatsugi, Osaka (JP); Masahiro Adachi, Osaka (JP); Yasuhiro Okuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 254 days.

(21) Appl. No.: 12/738,043

(22) PCT Filed: Mar. 19, 2009

(86) PCT No.: PCT/JP2009/055392
§ 371 (c)(1),
(2), (4) Date: Apr. 14, 2010

(87) PCT Pub. No.: WO2009/119426
PCT Pub. Date: Jan. 10, 2009

(65) Prior Publication Data
US 2010/0220963 A1 Sep. 2, 2010

(30) Foreign Application Priority Data
Mar. 26, 2008 (JP) .................................. 2008-081686

(51) Int. Cl.
*G02B 6/36* (2006.01)

(52) U.S. Cl. ................................ 385/88; 385/49; 385/89
(58) Field of Classification Search ................. 385/49, 385/88–94
See application file for complete search history.

(56) References Cited

U.S. PATENT DOCUMENTS
6,530,698 B1 * 3/2003 Kuhara et al. .................. 385/88
(Continued)

FOREIGN PATENT DOCUMENTS
JP 2000-347072 A 12/2000
(Continued)

OTHER PUBLICATIONS

Notification of First Office Action of the corresponding Chinese Application No. 200980100642, dated Oct. 24, 2011.

*Primary Examiner* — Daniel Petkovsek
(74) *Attorney, Agent, or Firm* — Global IP Counselors, LLP

(57) ABSTRACT

An object is to obtain a module in which an optical fiber can be inserted after a ferrule has been mounted on a circuit board. There is provided an optical module (100) in which at least a ferrule (33) and an electric component (57) are mounted on a circuit board (35) on which external electrodes (63) have been mounted; a fiber through-hole is formed in the ferrule (33) in a position in which the optoelectric conversion device (31) is mounted on one end surface and that corresponds to an active layer of an optoelectric conversion device (31); and the optoelectric conversion device (31) of the ferrule (33) is electrically connected to the electric component (57). In the ferrule (33), an opening in the one end face of the fiber through-hole that faces the optoelectric conversion device (31) is blocked by a transparent substance (61), and a portion that excludes the fiber through-hole at the other end surface is are monolithically covered with a molding resin (55).

11 Claims, 6 Drawing Sheets

U.S. PATENT DOCUMENTS

| | | | |
|---|---|---|---|
| 7,020,366 B2 * | 3/2006 | Nakanishi et al. | 385/37 |
| 7,065,275 B2 * | 6/2006 | Miyamae | 385/49 |
| 7,192,199 B2 * | 3/2007 | Furuyama et al. | 385/89 |
| 7,301,139 B1 | 11/2007 | Sakurai et al. | |
| 7,350,983 B2 | 4/2008 | Saitoh et al. | |
| 7,366,367 B2 * | 4/2008 | Kuhara et al. | 385/14 |
| 2001/0024553 A1 * | 9/2001 | Nakanishi et al. | 385/94 |
| 2003/0081911 A1 | 5/2003 | Ide et al. | |
| 2005/0141824 A1 | 6/2005 | Furuyama et al. | |
| 2006/0039658 A1 | 2/2006 | Furuyama et al. | |
| 2006/0291783 A1 | 12/2006 | Hamasaki et al. | |
| 2008/0001148 A1 | 1/2008 | Nishi et al. | |
| 2008/0095505 A1 | 4/2008 | Sakurai et al. | |
| 2009/0097802 A1 | 4/2009 | Tamura et al. | |

FOREIGN PATENT DOCUMENTS

| | | |
|---|---|---|
| JP | 2001-127312 A | 5/2001 |
| JP | 2001-159724 A | 6/2001 |
| JP | 2001-281503 A | 10/2001 |
| JP | 2004-317632 A | 11/2004 |
| JP | 2005-189604 A | 7/2005 |
| JP | 2005-189605 A | 7/2005 |
| JP | 2005-331879 A | 12/2005 |
| JP | 2006-003648 A | 1/2006 |
| JP | 2006-013462 A | 1/2006 |
| JP | 2006-059867 A | 3/2006 |
| JP | 2006-146084 A | 6/2006 |
| JP | 2007-003906 A | 1/2007 |

\* cited by examiner

OPTOELECTRIC CONVERSION MODULE, METHOD FOR ASSEMBLING SAME, AND OPTOELECTRIC INFORMATION PROCESSOR USING SAME

TECHNICAL FIELD

The present invention relates to an optoelectric conversion module to which an optical fiber can be attached after the optoelectric conversion module has been mounted on a circuit board, a method for assembling the optoelectric conversion module, and an optoelectric information processor that uses the optoelectric conversion module.

BACKGROUND ART

With higher-speed inter-LSI signals, it has become difficult to solve the problems of greater noise and power consumption by using electric transmission. In view of these problems, attempts have been made to carry out inter-LSI transmissions using light, which has substantially no electromagnetic interference and no frequency-dependent loss. For example, Japanese Laid-open Patent Application No. 2006-59867 describes an optoelectric conversion header (optoelectric conversion module) that is used for inter-LSI optical transmissions and is provided with an optoelectric conversion device and a ferrule which is insert-molded with a lead and into which an optical fiber is inserted. In this optoelectric conversion module, the optoelectric conversion device and the optical fiber have a direct optical connection without the use of a lens or another optical component. In this case, the optoelectric conversion device is a light-emitting device (e.g., Vertical Cavity Surface Emitting Laser (VCSEL)) or a light-detecting device.

FIG. 10 is a cross-sectional view of the essential part of such a conventional optoelectric conversion module showing the flow of resin when the resin is molded during manufacture of the module. An optoelectric conversion module 1 is manufactured by first mounting an optoelectric conversion device 9 on a ferrule 3 having a through-hole (fiber through-hole) 7 through which an optical fiber (or optical waveguide) 5 is inserted. In this case, the optoelectric conversion device 9 and the electrode (not shown) of the ferrule 3 are connected, for example, by the heat pressure welding of an Au bump 11. Next, the optical fiber 5 is inserted into the ferrule 3. The optical fiber 5 is thereby positioned in the optoelectric conversion device 9. Lastly, the ferrule 3 and the optoelectric conversion device 9 are molded using resin (not shown).

The module 1 into which the optical fiber 5 has been inserted is mounted on a circuit board (not shown), connected with an optoelectric conversion device driver ICs (driver, receiver, or the like) via a bonding wire. Then the ferrule 3, the optoelectric conversion device 9, the optoelectric conversion device driver ICs, and the circuit board are monolithically molded using resin. With the module 1, a smaller size and lower costs can be expected because the optical fiber 5 is directly inserted into and connected to the ferrule 3 that is to be mounted on the board.

However, unlike ordinary electrical components, the module 1 cannot be mounted on the circuit boards using high-temperature heating process, such as reflowing, because the coating resin of the mounted optical fiber 5 degrades at high temperature. Also, mounting using high-temperature heating is not possible for the same reasons when a module in which the module 1 is mounted (that is to say, in which an optoelectric conversion device, a ferrule, and a circuit board are monolithically molded using a resin) is incorporated in an apparatus-side board, and this is an obstacle to the mass production of optoelectric information processors. In contrast, if the assembly of the optical fiber 5 is omitted, the resin that is used for molding the optoelectric conversion device 9, the ferrule 3, and the circuit board enters, as shown by the arrow in FIG. 10, from the opening 7a of the fiber through-hole 7 formed at one end 3a of the ferrule 3 and later becomes an obstruction to the insertion of the optical fiber 5.

SUMMARY OF THE INVENTION

Technical Problems

An object of the present invention is to provide an optoelectric conversion module in which an optical fiber can be inserted even after the ferrule has been mounted on a circuit board, to provide a method for assembling the optoelectric conversion module, and to provide an optoelectric information processor that has the optoelectric conversion module.

Solution to the Problems

In order to achieve the aforementioned object, there is provided an optoelectric conversion module comprising a ferrule having a fiber through-hole therethrough; a transparent substance for blocking an opening of the fiber through-hole in one end surface of the ferrule; an optoelectric conversion device having an active layer, the optoelectric conversion device being mounted on the one end surface so that the active layer faces the opening; an electric component to which the optoelectric conversion device is electrically connected; and a circuit board for mounting the ferrule and the electric component.

The transparent substance may be a transparent film. It is preferred that the transparent film be a bilayer structure composed of a hard layer and a soft layer, and the soft layer be disposed toward the ferrule side. The transparent substance may be an adhesive or an anisotropic electroconductive film.

In these optoelectric conversion modules, it is preferred that the portion excluding the fiber through-hole of the ferrule be monolithically covered by a molding resin. In such a case, the ferrule preferably has a resin-pouring gap in a region set apart from the molding resin, the gap configured for pouring resin to secure the optical fiber.

In these optoelectric conversion modules, it is preferred that the ferrule have catching means to hold optical fiber inserted to the fiber through-hole and preventing rearward dislodgement. In addition, in these optoelectric conversion modules, it is preferred that a portion of the fiber through-hole be a bended fiber accommodating space configured to accommodate a curved portion of the optical fiber.

According to another aspect of the present invention, there is provided a method for assembling an optoelectric conversion module, comprising the steps of: blocking an opening of a fiber through-hole in one end surface of a ferrule by using a transparent substance; breaking down the transparent substance and electrically connecting a bump of the optoelectric conversion module to an electrode formed on the one end face; mounting an electric component and the ferrule on a circuit board on which an external electrode is mounted; and covering the ferrule excluding the opening of the fiber through-hole in another end face, the optoelectric conversion device, and the electric component, by a molding resin monolithically with the circuit board.

According to yet another aspect of the present invention, there is provided an optoelectric information processor having the module of the present invention mounted on an apparatus-side board, the optoelectric information processor being assembled by inserting a terminated optical fiber into the fiber through-hole of the module after the module has been mounted on the apparatus-side board.

Advantage of the Invention

With the module of the present invention, a transparent substance prevents molding resin from entering from the opening, and the optoelectric conversion device, the ferrule, the electric component, and the circuit board can be monolithically formed before an optical fiber is inserted. The optical fiber can be inserted after the ferrule has been mounted on the circuit board, and the optical fiber can furthermore be inserted after the module itself is mounted on the apparatus-side board. Productivity can be improved, because, in comparison with a conventional module in which an optical fiber has been inserted, it is possible to perform mounting on an apparatus-side board or a circuit board with high-temperature heating process such as reflowing and to use resin molding after mounting. With the method for assembling an optoelectric conversion module according to the present invention, it is possible to obtain a module that allows the optical fiber to be assembled later. With the optoelectric information processor according to the present invention, a module can be mounted on an apparatus-side board with high-temperature heating process such as reflowing, and productivity can be improved.

DESCRIPTION OF EMBODIMENTS

Figure 1:
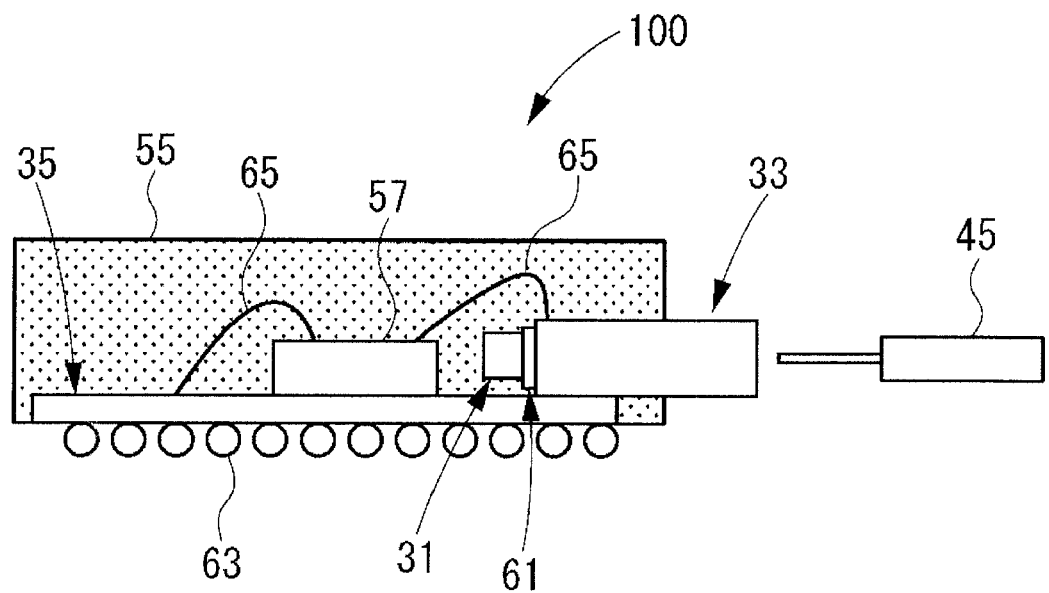
FIG. 1 is a side view showing an embodiment of the optoelectric conversion module according to the present invention.

Embodiments of the present invention are described below with reference to the drawings. The drawings are used for descriptive purposes and do not intend to limit the scope of the invention. The same reference numerals indicate the same portions in the drawings in order to avoid redundant description. The ratios of the dimensions in the drawings are not necessarily accurate.

FIG. 1 is a side view showing an optoelectric conversion module 100 according to an embodiment of the present invention. The optical module 100 has a ferrule 33 and an electric component 57 mounted on a surface of a circuit board 35. External electrodes 63 are formed on the other surface of the circuit board 35. Of the circuit board 35, the surface of the side on which the components are mounted as well as the electric component 57 and a portion of the ferrule 33 are covered with a molding resin 55. An optical fiber can be attached to the optical module 100 in a later step.

The electric component 57 is, e.g., an optoelectric conversion device driver IC (drivers, transformer impedance amplifiers, and the like). The electric component 57 is connected to the ferrule 33 and the circuit board 35 via a bonding wire 65. The ferrule 33 is made of a material containing any one of a polyester resin, a PPS resin, and an epoxy resin.

Figure 2:
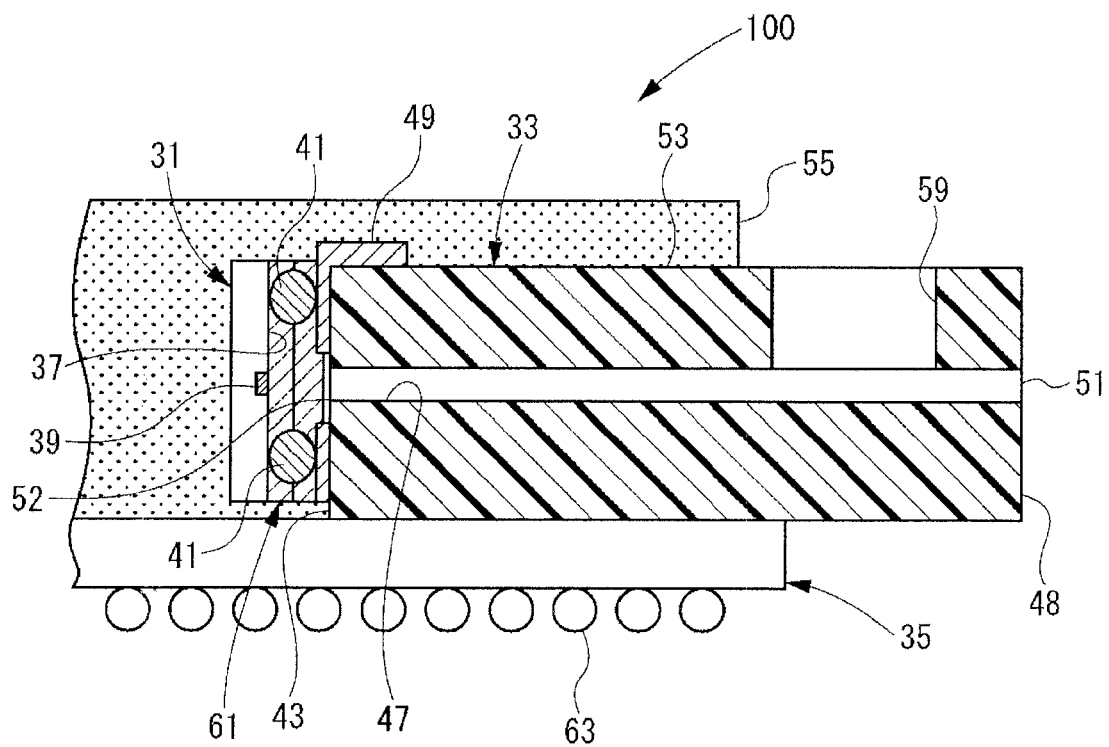
FIG. 2 is a partial enlarged view of the optoelectric conversion module of FIG. 1.

FIG. 2 is a partial enlarged view of the optoelectric conversion module 100. A plurality of extractor electrodes 49 as electric circuits is disposed in parallel on a connecting surface 43 of the ferrule 33, and the electrodes 49 are extended to and connectively formed on an intersecting surface (upper surface of FIG. 2) adjacent to the connecting surface 43. An optoelectric conversion device 31 is mounted on the connecting surface 43 of the ferrule 33.

The optoelectric conversion device 31 is, e.g., a VCSEL or a photodiode (PD). A plurality of active layers 39 is disposed on a connecting surface 37 of the optoelectric conversion device 31. The active layers 39 have a plurality of Au bumps 41 as connection terminals disposed along the active layers 39. The optoelectric conversion device 31 is mounted on the ferrule 33 by connecting the bumps 41 to the electrodes 49. The Au bumps 41 can be secured to the electrodes 49 by ultrasonic pressure welding.

A plurality of fiber through-holes 47 for positioning and holding an optical fiber 45 is disposed on the connecting surface 43 of the ferrule 33 in accordance with the active layers 39. At the other end surface 48 of the ferrule 33, the fiber through-holes 47 are openings as fiber entrances 51.

The bonding wire 65 is connected to the electrodes 49 of the ferrule 33. In other words, the electric component 57 is electrically connected to the optoelectric conversion device 31 via the electrodes 49 on the ferrule 33. The optoelectric conversion device 31 can be supplied with electric power and can output signals via the electric component 57 by molding a ferrule 33 on the circuit board 35. In addition, the optical fiber 45 inserted into the fiber through-holes 47 of the ferrule 33 is optically connected to the active layers 39 of the optoelectric conversion device 31.

An opening 52 of the ferrule 33 is blocked by a transparent substance 61 in the optical module 100. With the configuration, it is possible to prevent the molding resin 55 from entering from the opening 52 when the resin 55 is molded. Therefore, the optical fiber 45 can be mounted in a later step, and the optical module 100 can be mounted with high-temperature heating process such as reflowing, which is difficult for a conventional module in which the optical fiber 45 is mounted in advance.

In the optical module 100, a portion 53 of the ferrule 33, excluding the fiber entrances 51, is covered with the molding resin 55 monolithically with the optoelectric conversion device 31, the circuit board 35, and the electric component 57. Accordingly, the optical fiber can be readily mounted after the module has been mounted as a component on the apparatus-side board, because the bonding strength between the optoelectric conversion device and the ferrule is enhanced, the bonding wires between the ferrule and the electric component are protected, and the external electrodes are mounted on the circuit board.

The transparent substance 61 is a transparent film in the optical module 100. By using a transparent film as the transparent substance 61, the transparent substance 61 can be easily mounted in the opening 52. In other words, a film can facilitate mounting because of the adhesive layer formed on the bonding surface. Impacts during insertion and assembly of the optical fiber can be absorbed by the elasticity in the thickness direction of the film, and damage to the optoelectric conversion device 31 can be prevented. Examples of the material of the transparent film 61 include acrylic resin, styrene resin, silicone resin, and olefin resin. Silicone resin in particular is resistant to high temperatures and does not degrade at the reflowing temperatures used in electronic packaging. The entire transparent film can be made of an adhesive. Thus, it is possible to expect an advantage in which the bonding strength between the ferrule and the optoelectric conversion module is enhanced.

The transparent film 61 is preferably provided as common single file to the plurality of fiber through-holes 47. The plurality of fiber through-holes 47 are covered with a single transparent film 61 in a single process, and the assembly operation is facilitated.

The transparent film 61 preferably has a function for suppressing noise due to backward propagating light. The transparent film 61 can be a refractive index matching film. As described in Japanese patent application publication No. 2006-59867, since the transparent film 61 cannot necessarily be perfectly matched to the refractive index of the optical fiber 45, a small amount of residual reflection remains. Since the transparent film 61 has a reflective index higher than the ambient air, the light of residual reflection is reflected to the interior at the boundary and is confined within the transparent film 61. The residual reflected light becomes backward propagating light, increases the noise level of the VCSEL, and causes jitter or the like to increase when very high-speed transmissions are carried out. It is preferred that a light-absorbing resin be provided to the portion that corresponds to the air-film boundary of the transparent film 61 in order to solve this problem of confined light.

Figure 3:
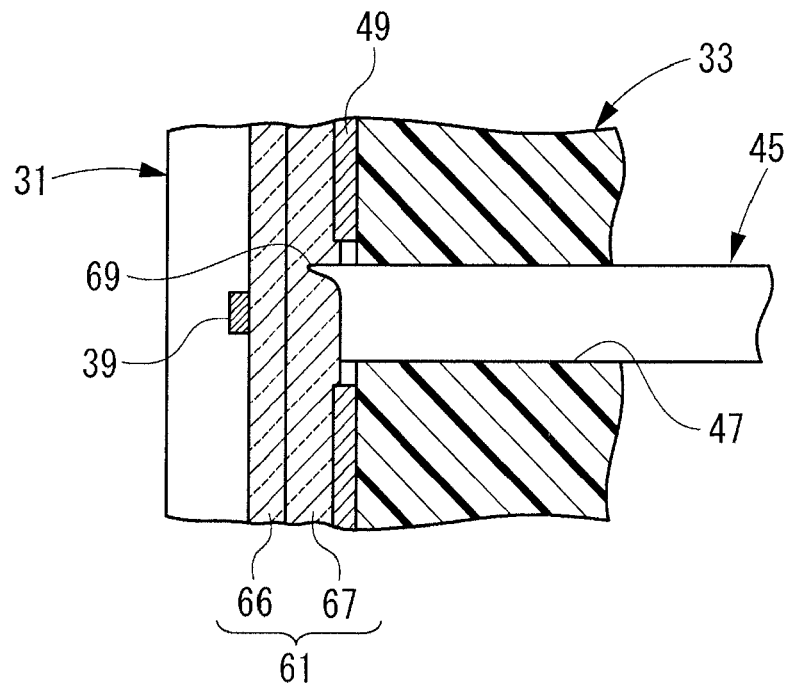
FIG. 3 is an enlarged view of an example of an area in the vicinity of the opening after the optical fiber has been inserted.

FIG. 3 is an enlarged view of an example of an area in the vicinity of the opening 52 after the optical fiber 45 has been inserted. In this example, the transparent film 61 is a bilayer structure composed of a hard layer 66 and a soft layer 67, and the soft layer 67 is disposed on the ferrule 33 side. The soft layer 67 provides accommodation for concavities and convexities, as well as protrusions 69 produced when the optical fiber 45 is cut, making it possible to form a good connection between the optical fiber 45 and the optoelectric conversion device 31. In addition, the hard layer 66 prevents damage to the active layers 39 or the like.

A resin-pouring gap 59 may be formed in the ferrule 33 as the optical module 100 (FIG. 2), and in such a case, molding is carried out so that the resin-pouring gap 59 is not covered by the molding resin 55. The optical fiber 45 mounted to the board-mounted optical module 100 by inserting into the ferrule 33 can thereby be reliably secured with an adhesive injected into the resin-pouring gap 59.

Figure 4:
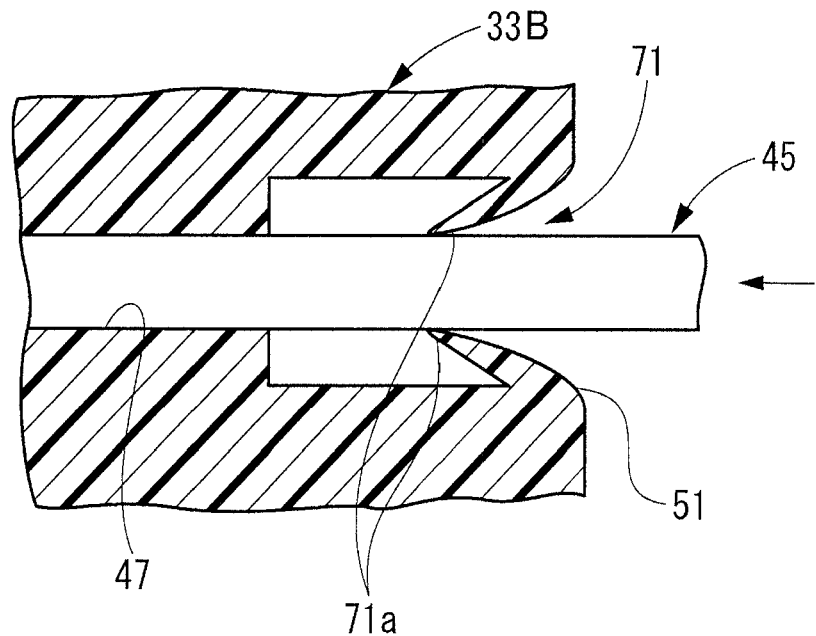
FIG. 4 is a cross-sectional view showing a modified example of the ferrule in the optoelectric conversion module of the embodiments.

FIG. 4 is a cross-sectional view showing a modified example of the ferrule in the optoelectric conversion module 100. A ferrule 33B has a catching means 71 for holding the optical fiber 45 inserted into the fiber through-hole 47 and preventing the rearward dislodgement of the optical fiber 45.

An example of the catching means 71 is a plurality of elastic flexible pawls 71a that protrude from the edge of the fiber entrance 51 toward the insertion direction of the optical fiber 45. The catching means 71 can prevent rearward dislodgement of the optical fiber 45 mounted to the board-mounted optical module 100, and the optical fiber 45 can be fixed to the optical module 100 in a simple manner using only an insertion operation.

Figure 5:
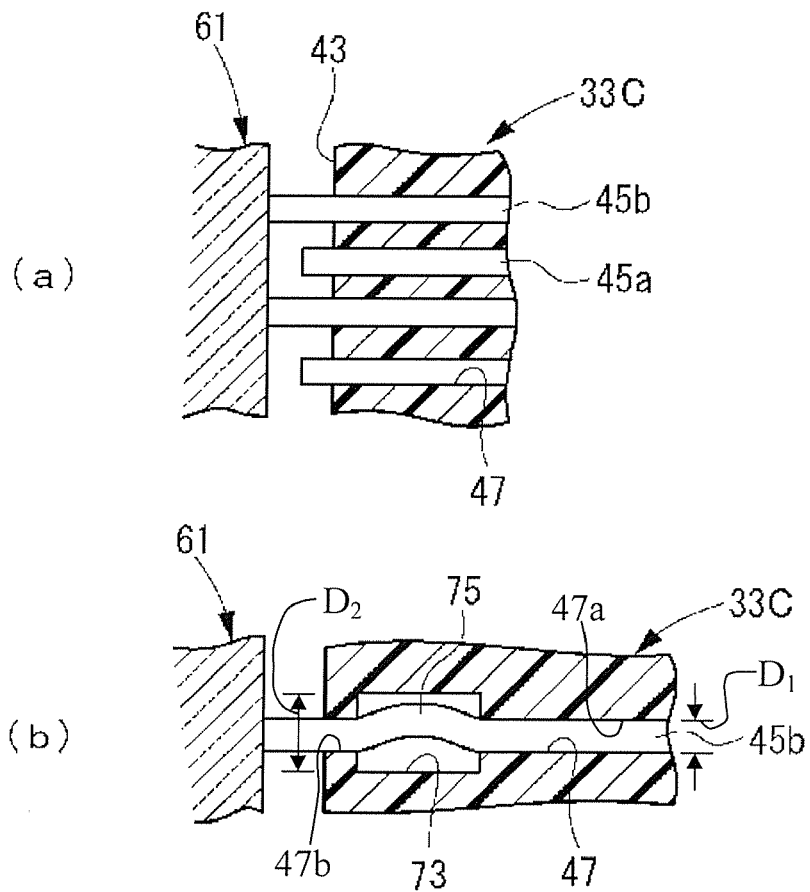
In FIG. 5, region (a) is a cross-sectional view, sectioned along the arranging surface of the optical fiber, showing another modified example of the ferrule in the optoelectric conversion module of the embodiments, and region (b) is a cross-sectional view sectioned vertical to the arranging surface.

In FIG. 5, region (a) is a cross-sectional view, sectioned along the arranging surface of the optical fiber, showing another modified example of the ferrule in the optoelectric conversion module 100, and region (b) is a cross-sectional view sectioned vertical to the arranging surface. A ferrule 33C has, in a portion of each of the fiber through-holes 47, a fiber accommodating space 73 that is used to accommodate the curved portion 75 of the optical fiber 45. The fiber accommodating space 73 can be formed by widening the diameter of a portion of the distal end side of the fiber through-hole 47. Specifically, the fiber through-holes 47 have a main section 47a, a distal end section 47b and the fiber accommodating space 73 located between the main section 47a and the distal end section 47b. The main section 47a and the distal end section 47b each define a first diameter $D_1$, as depicted in FIG. 5(b). The fiber accommodating space 73 is widened to a dimension $D_2$ measured between surfaces thereof parallel to the first diameter $D_1$, as depicted in FIG. 5(b), the dimension $D_2$ being larger than the first diameter $D_1$. When a plurality of optical fibers (particularly of an optical fiber ribbon) 45 that has been cut and disposed in parallel with slightly uneven distal-end lengths is inserted and mounted at the same time in the ferrule 33C (FIG. 5(a)), and they are pressed inward in alignment with the optical fibers 45a disposed in the rearmost position from the distal end (FIG. 5(b)), the excess length of the longer-protruding optical fibers 45b flexes, bends and forms a curved portion 75 and is accommodated in the fiber accommodating space 73. As a result, a good connection is formed between the transparent film 61 and the distal end surface of all the optical fibers.

Figure 6:
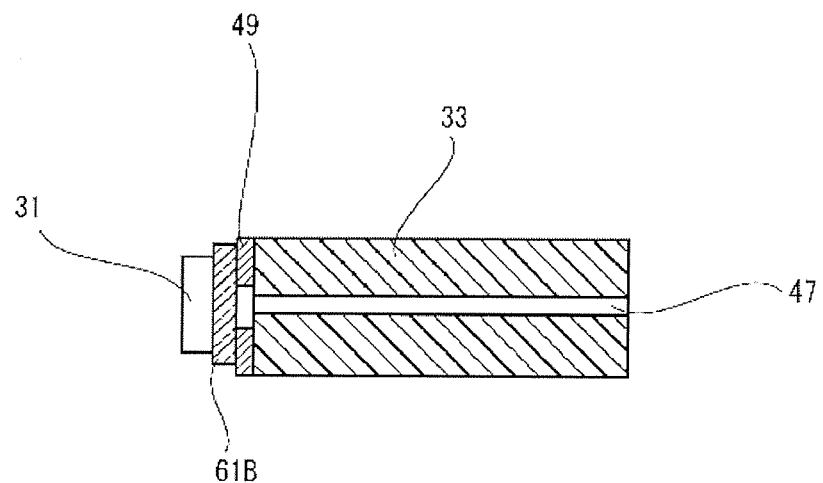
FIG. 6 is a cross-sectional view showing a modified example of the transparent substance in the optoelectric conversion module of the embodiments.

FIG. 6 is a cross-sectional view showing a modified example of the transparent substance in the optoelectric conversion module 100. In this example, the transparent substance is an anisotropic electroconductive film 61b. The anisotropic electroconductive film 61b has metal particles dispersed in the refractive index-matching film, and has a property in which the resistance between conductors is reduced to provide conductivity when the anisotropic electroconductive film is held between two electro-conductors and is pressed or heated (SEI Technical Review, No. 168, Page 93). The electrode 49 and the optoelectric conversion device 31 can be electrically connected without the use of metal bumps while maintaining the insulation of mutually adjacent electrodes 49 by using the anisotropic electroconductive film 61b as the transparent substance. Acicular nickel nanoparticles are particularly preferred as the metal particles. Since a small amount of acicular nickel nanoparticles reliably connect conductors, the dispersion amount is low and transparency can be kept high.

Figure 7:
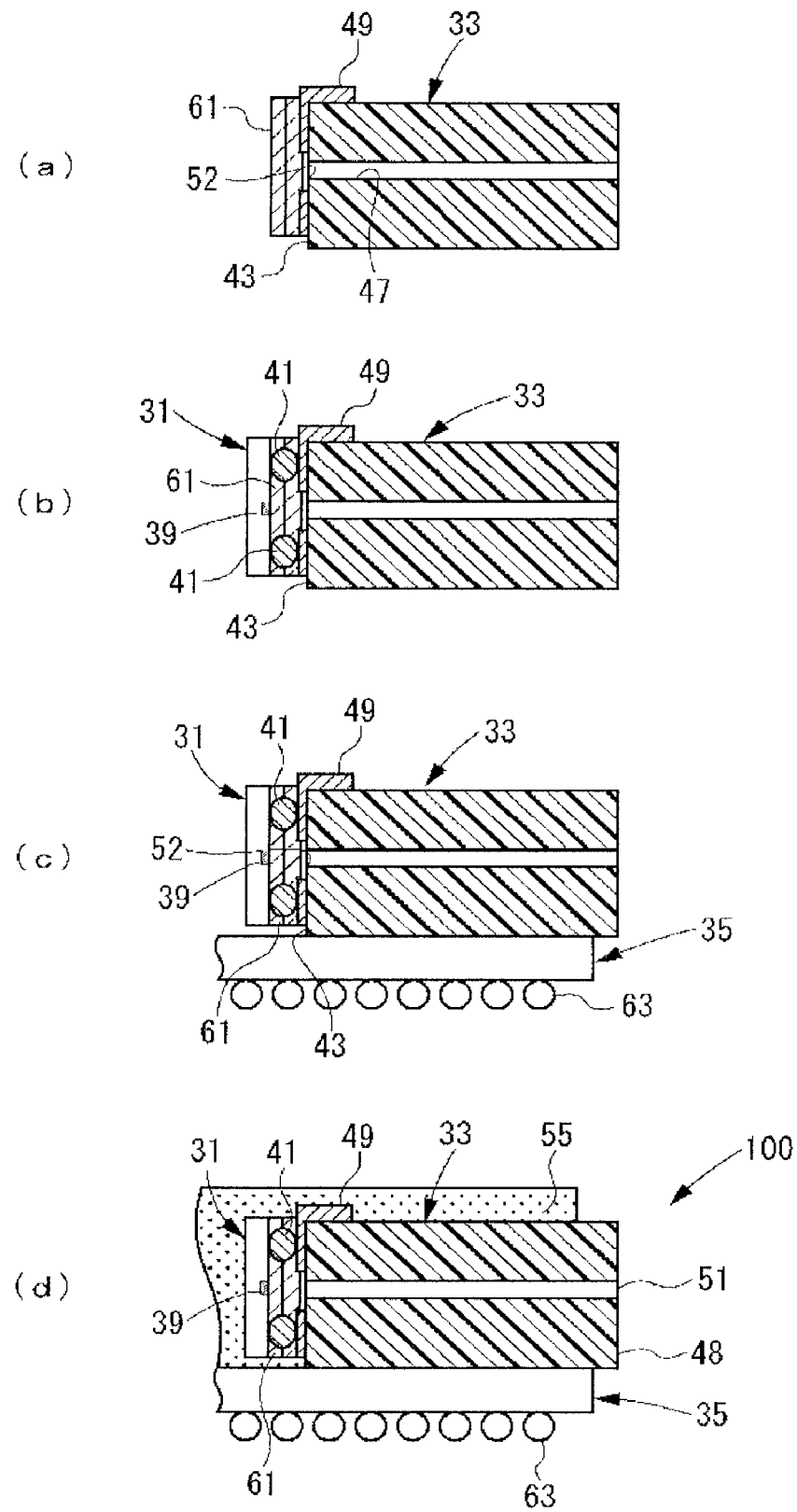
In FIG. 7 regions (a) to 7(d) are conceptual views showing the steps of the method for assembling the optical module 100.
Figure 8:
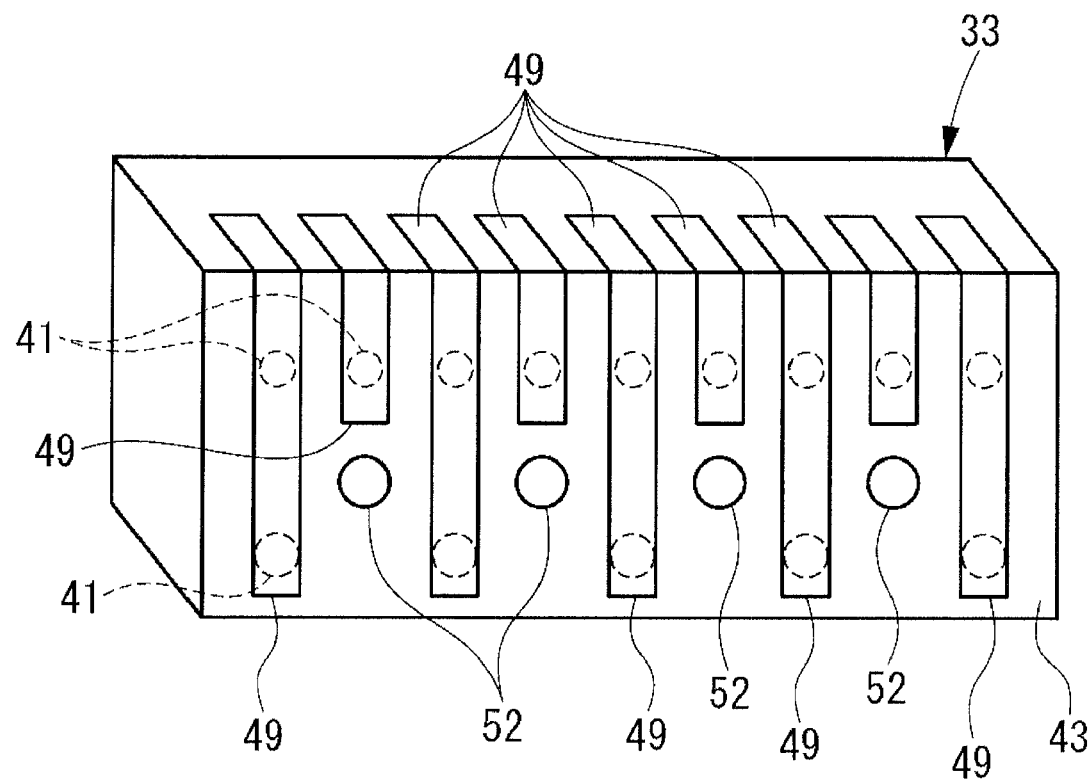
FIG. 8 is a perspective view showing an example of an end face of the ferrule provided with a plurality of electrodes.

Next, the method for assembling the optical module 100 will be described. In FIG. 7, regions (a) to 7(d) are conceptual views showing the steps of the method for assembling the optoelectric conversion module 100. FIG. 8 is a perspective view showing an example of an end face of the ferrule provided with a plurality of electrodes. In order to assemble the optical module 100, first, the opening 52 of the fiber through-holes 47 formed in the bonding surface 43 of the ferrule 33 is covered with the transparent film 61, as shown in region (a).

Next, the transparent film 61 is broken apart (pierced) and the bumps 41 of the optoelectric conversion device 31 are electrically connected to the electrodes 49 formed on the connecting surface 43 of the ferrule 33, as shown in region (b). In this state, the bumps 41 can be connected to a plurality of electrodes 49 such as those exemplified in FIG. 8 in a manner where only the necessary portions of the transparent film 61 are broken apart. The connecting surface 43 can thereby covered with a single transparent film 61 in a single operation, a fiber through-hole 47 is not required to be individually covered, and the film can be applied in an efficient manner.

Next, at least the electric component 57 and the ferrule 33 are mounted on the circuit board 35 on which the external electrodes 63 have been mounted, as shown in region (c). Once the electric component 57 and the ferrule 33 have been mounted, the electric component 57 and the electrodes 49 of the ferrule 33, and the electric component 57 and the terminals of the circuit board 35 are connected with a bonding wire 65.

Lastly, a portion of the ferrule 33, excluding the fiber entrance 51 at the other end surface 48, the optoelectric conversion device 31, the bonding wire 65, the electric component 57, and the circuit board 35, are covered with the molding resin 55 monolithically, as shown in region (d). An optical module 100 to which the optical fiber 45 can be attached later is thereby obtained.

In this manufacturing method, the molding resin 55 that may enters into the gap between the optoelectric conversion device 31 and the ferrule 33 during resin molding is blocked by the transparent film 61 and does not enter into the fiber through-holes 47. Since the transparent substance is broken apart and the bumps are connected to the electrodes, the end surface can be covered with a single transparent substance in a single operation, and since the fiber through-holes are not required to be individually covered, the processability can be improved.

Figure 9:
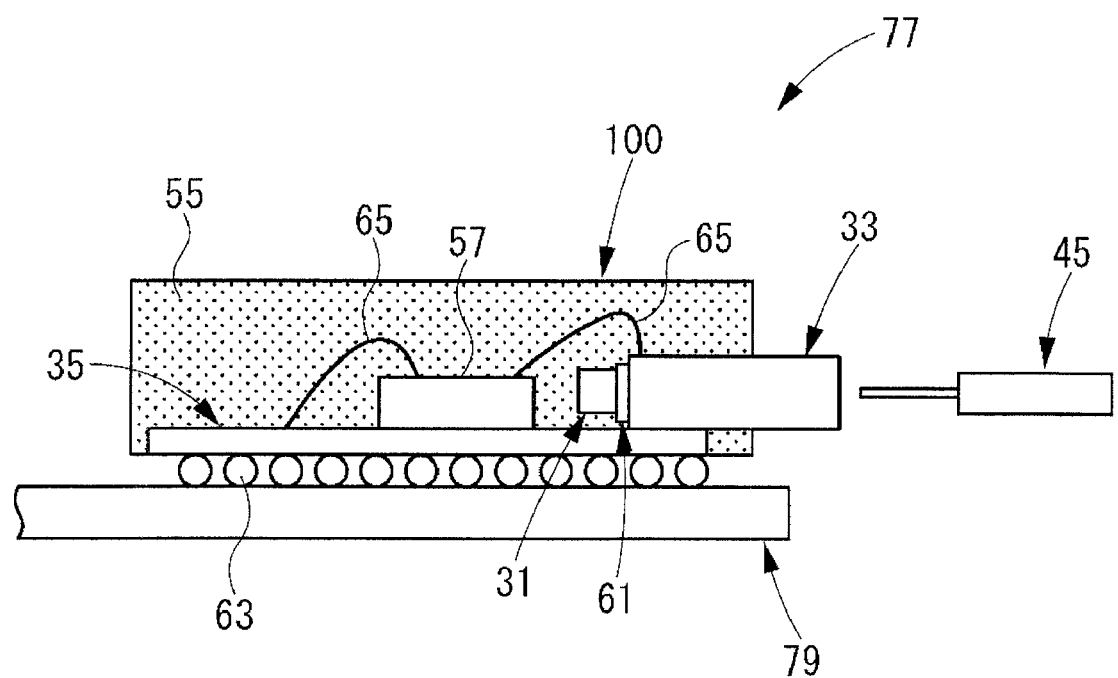
FIG. 9 is a side view showing the essential part of an embodiment of the optoelectric information processor of the present invention.
Figure 10:
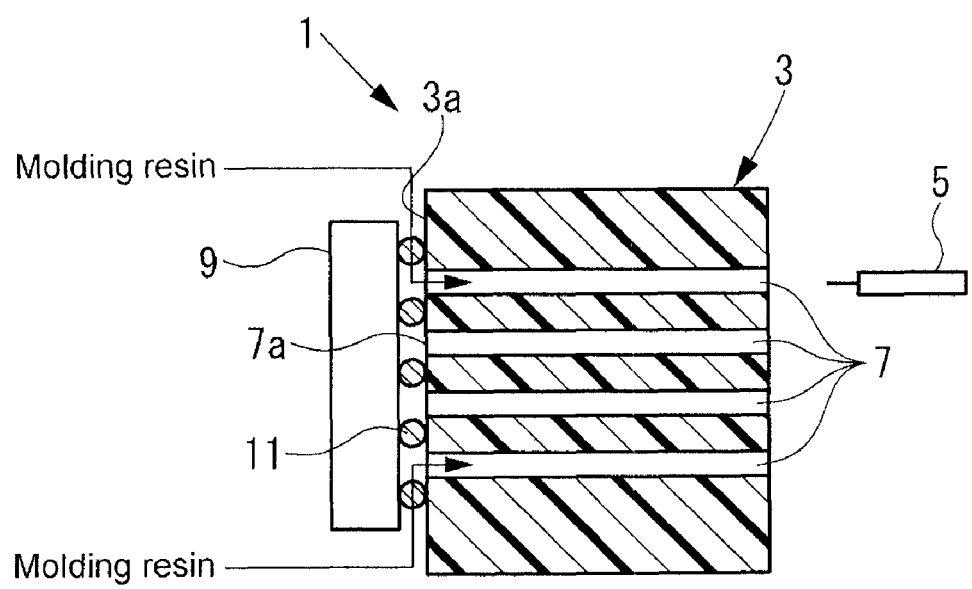
FIG. 10 is a plane cross-sectional view showing the essential part of the flow of resin when the resin is molded in a conventional optical module.

FIG. 9 is a side view showing the essential part of an optoelectric information processor 77 as an embodiment of the present invention. The optoelectric information processor 77 has the optoelectric conversion module 100 mounted on an apparatus-side board 79, and is connected to a circuit on the apparatus-side board 79 via the external electrodes 63.

In the optoelectric information processor 77, the terminated optical fiber 45 can be insertably assembled in the fiber through-holes 47 of an optical module 100 that has been mounted on the apparatus-side board 79. The optical module 100 can be mounted on the apparatus-side board 79 with high-temperature heating process such as reflowing, which is difficult for a conventional module, and productivity can be increased.

As described above, with the optoelectric conversion module and method for assembling the same according to the present invention, the optical fiber 45 can be inserted after the ferrule 33 has been mounted on the circuit board 35, and the optical fiber 45 can be inserted after the optical module 100 itself has been mounted on the apparatus-side board 79. It is possible to mount the components on the circuit board 35 and the apparatus-side board 79 with high-temperature heating process such as reflowing, which is difficult for a conventional module in which the optical fiber 45 has been inserted, and it is possible to mold the assembly with a resin after mounting has been performed, thereby increasing productivity.

The present application is based on Japanese Patent Application (No. 2008-081786) filed on Mar. 26, 2008, which is incorporated herein by reference.

Industrial Applicability

The optoelectric conversion module of the present invention is applicable as an optoelectric conversion module used in optical transmissions between LSI.

the invention claimed is:

1. An optoelectric conversion module comprising:
a ferrule having a fiber through-hole therethrough, the fiber through-hole having a main section, a distal end section and a fiber accommodating space located between the main section and the distal end section, the main section and the distal end section defining a first diameter and the fiber accommodating space having a widened space with a dimension measured between surfaces thereof parallel to the first diameter that is larger than the first diameter;
a transparent substance configured to block an opening of the fiber through-hole in one end surface of the ferrule;
an optoelectric conversion device having an active layer, the optoelectric conversion device being mounted on the one end surface so that the active layer faces the opening;
an electric component to which the optoelectric conversion device is electrically connected; and
a circuit board configured to mount the ferrule and the electric component.

2. The optoelectric conversion module according to claim 1,
wherein the transparent substance is a transparent film.

3. The optoelectric conversion module according to claim 2,
wherein the transparent film is a bilayer structure composed of a hard layer and a soft layer, and the soft layer is disposed toward the ferrule side.

4. The optoelectric conversion module according to claim 1,
wherein the transparent substance is an adhesive.

5. The optoelectric conversion module according to claim 1,
wherein the transparent substance is an anisotropic electroconductive film.

6. The optoelectric conversion module according to claim 1,
wherein a portion that excludes the fiber through-hole of the ferrule is monolithically covered by a molding resin.

7. The optoelectric conversion module according to claim 6,
wherein the ferrule has a resin-pouring gap in a region set apart from the molding resin, the gap configured for pouring resin to secure the optical fiber.

8. The optoelectric conversion module according to claim 1,
wherein the ferrule has catching means to hold optical fiber inserted to the fiber through-hole and preventing rearward dislodgement.

9. An optoelectric information processor having the module of claim 1 mounted on an apparatus-side board, the optoelectric information processor being assembled by inserting a terminated optical fiber into the fiber through-hole of the module after the module has been mounted on the apparatus-side board.

10. The optoelectric conversion module according to claim 1,
wherein the ferrule includes a plurality of the fiber through-holes.

11. A method for assembling an optoelectric conversion module, comprising the steps of:
blocking an opening of a fiber through-hole in one end surface of a ferrule by using a transparent substance, the fiber through-hole having a main section, a distal end section and a fiber accommodating space located between the main section and the distal end section, the main section and the distal end section defining a first diameter and the fiber accommodating space having a widened space with a dimension measured between surfaces thereof parallel to the first diameter that is larger than the first diameter;

breaking down the transparent substance and electrically connecting a bump of the optoelectric conversion module to an electrode formed on the one end face;

mounting an electric component and the ferrule on a circuit board on which an external electrode is mounted; and covering the ferrule excluding the opening of the fiber through-hole in another end face, the optoelectric conversion device, and the electric component, by a molding resin monolithically with the circuit board.

* * * * *